United States Patent [19]
Ooami et al.

[11] Patent Number: 4,692,900
[45] Date of Patent: Sep. 8, 1987

[54] SEMICONDUCTOR MEMORY DEVICE HAVING BLOCK PAIRS

[75] Inventors: Kazuo Ooami; Yasuhisa Sugo, both of Yokohama; Tohru Takeshima, Tokyo, all of Japan

[73] Assignee: Fujitsu Limited, Kawasaki, Japan

[21] Appl. No.: 715,835

[22] Filed: Mar. 25, 1985

[30] Foreign Application Priority Data

Mar. 30, 1984 [JP] Japan ................. 59-060600

[51] Int. Cl.[4] .................. G11C 5/06; G11C 29/00
[52] U.S. Cl. ...................... 365/63; 365/190; 365/201; 365/179; 365/230
[58] Field of Search ............... 365/155, 179, 190, 201, 365/189, 51, 63, 230; 371/21

[56] References Cited

U.S. PATENT DOCUMENTS 4,298,961 11/1981 Hotta et al. ................. 365/179
4,376,985 3/1983 Isogai ..................... 365/155
4,456,979 6/1984 Isogai ..................... 365/190

Primary Examiner—James W. Moffitt
Assistant Examiner—Glenn A. Gossage
Attorney, Agent, or Firm—Staas & Halsey

[57] ABSTRACT

A semiconductor memory device provided with at least one block pair. Each block contains therein bit line pairs, word lines, memory cells, and circuitry for writing data by cooperating with the bit line pairs. The wiring pattern of the writing part located in one of the blocks is reversed to that of the writing part located in another block adjacent thereto, whereby the two facing bit lines of different blocks assume opposite logic levels when the same data logic is written into all the memory cells.

9 Claims, 7 Drawing Figures

SEMICONDUCTOR MEMORY DEVICE HAVING BLOCK PAIRS

BACKGROUND OF THE INVENTION

The present invention relates to a semiconductor memory device.

In recent years, the tendency has been to form semiconductor memory devices (hereinafter referred to simply as "memories") with higher densities. As a result, a so-called 256K structure memory (random access memory (RAM) has come into practical use, wherein memory constructions of "256K word×1 bit" and "256K word×4 bit" are employed. The former memory construction features a one-block memory, and the latter memory construction features a four-block memory. Therefore, the latter type of memory produces so-called multibit outputs.

Such large capacity memories as mentioned above can neither be manufactured nor tested easily, since many steps are required for the performance test. In addition, it has becomes more complicated to test recent memories for performance, since the recent trend is to mount not only a memory but also various logic circuits on a single chip together with the memory at its periphery.

Under such circumstances, there is the problem that it is not easy to find short-circuits between bit lines in the memories, as between one block and another adjacent block, during a performance test. If such short-circuits of the bit lines are not found and are left as they are, they will cause write errors during usual write operations and/or read errors during usual read operations.

SUMMARY OF THE INVENTION

Accordingly, an object of the present invention is to provide an improved semiconductor memory device in which any short-circuits of bit lines between two adjacent blocks can be found very easily and in a very short time during a performance test, without increasing the number of steps for achieving the test.

To attain the above object, there is provided, according to the present invention, a semiconductor memory device provided with at least one block pair. Each block contains therein means for writing data and means for reading stored data. The wiring pattern of the writing and reading means pertaining to one block is partially reversed with respect to the wiring pattern of the writing and reading means pertaining to another block adjacent thereto, so as to produce logic signals opposite to each other at bit lines facing each other in the two adjacent blocks.

BRIEF DESCRIPTION OF THE DRAWINGS

The above object and features of the present invention will be more apparent from the following description of the preferred embodiments with reference to the accompanying drawings, wherein.

DESCRIPTION OF THE PREFERRED EMBODIMENTS

Before describing the preferred embodiments of the present invention, the prior art and the problems therein will be first explained further with reference to FIGS. 1 through 4.

Figure 1:
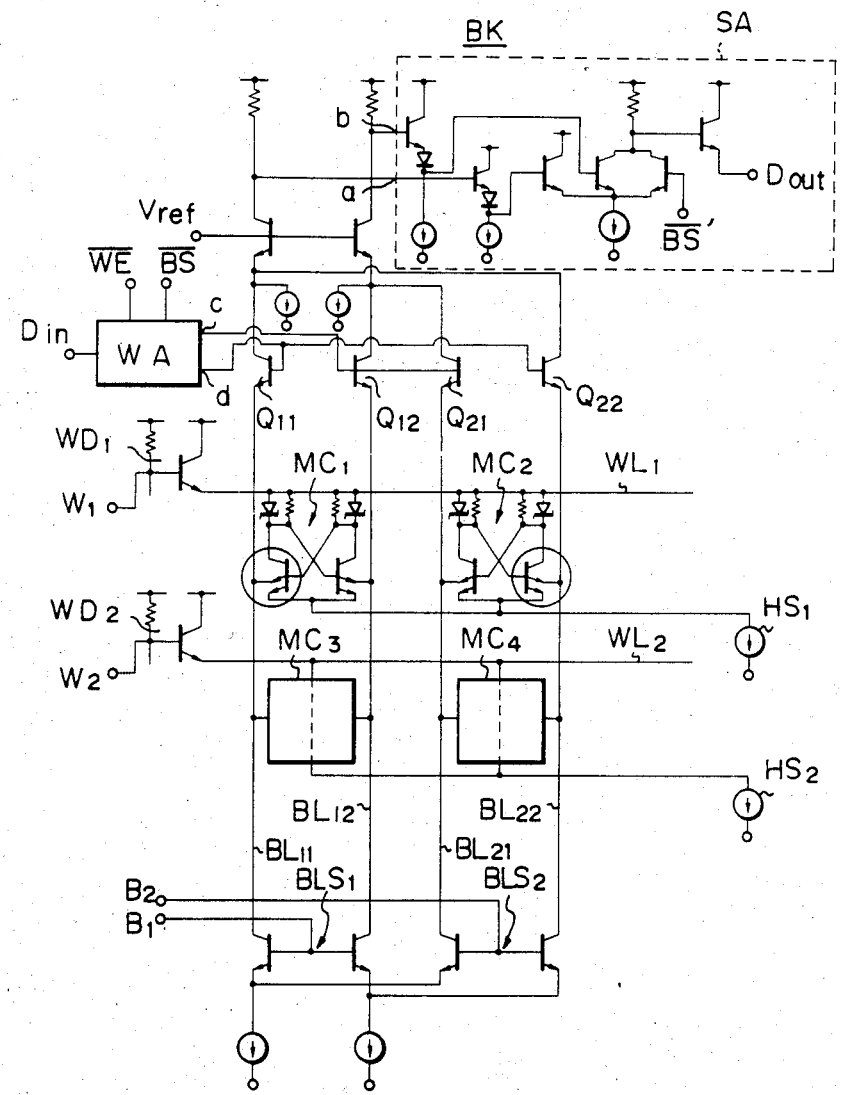
FIG. 1 is a circuit diagram of one block for composing a conventional memory device, i.e., a static RAM.

FIG. 1 is a circuit diagram of one block for composing a conventional memory device, i.e., a static RAM. The above-mentioned block is referred to with reference character "BK" in FIG. 1. With the use of the character "BK", the previously mentioned memory of 256K word×4 bit would be represented by four blocks $BK_0$, $BK_1$, $BK_2$, and $BK_3$. The four blocks have the same structure and effect the same operation.

The memory to which the present invention applies is constructed, in general, with at least one block pair, such as $BK_0$ and $BK_1$ (one pair) or $BK_0$ through $BK_3$ (two pairs). Each of the blocks comprises: a plurality of bit line pairs; a plurality of word lines intersecting therewith; a plurality of memory cells located at each intersection of bit line pairs and word lines; means for writing data; and means for reading stored data.

To be more specific, as shown in FIG. 1, the block BK is comprised of a sense amplifier SA for providing data to be read (stored data) $D_{out}$, a write amplifier (WA) for supplying data to be written (write data) $D_{in}$, a first read/write transistor pair $Q_{11}$, $Q_{12}$ for switching read and write operations, a second read/write transistor pair $Q_{21}$, $Q_{22}$ for performing identical switching to that of the pair $Q_{11}$, $Q_{12}$, a first bit line pair $BL_{11}$, $BL_{12}$ connecting with the first transistor pair $Q_{11}$, $Q_{12}$, respectively, a second bit line pair $BL_{21}$, $BL_{22}$ connecting with the second transistor pair $Q_{21}$, $Q_{22}$, respectively, a first bit line switching transistor pair $BLS_1$, a second bit line switching transistor pair $BLS_2$, a plurality of word lines $WL_1$, $WL_2$ intersecting with the bit line pairs $BL_{11}$, $BL_{12}$, $BL_{21}$, $BL_{22}$ and being driven by word drivers $WD_1$, $WD_2$ and so on, and a plurality of memory cells $MC_1$, $MC_2$, $MC_3$, $MC_4$ and so on located at each intersection between the bit line pairs and the word lines.

When, for example, a word line selection signal $W_1$ assumes the "H" level and, at the same time, a bit line selection signal $B_1$ assumes the "H" level, the memory cell $MC_1$ is selected. The data stored in each of the sources $HS_1$, $HS_2$, and so on.

The operations of the block BK will be clarified hereinafter. For this purpose, the structure of the block, particularly the portion relevant to the present invention, will first be explained. Plural sets of bit lines pairs are mounted in the memory, though only two sets, i.e., $BL_{11}$, $BL_{12}$ and $BL_{21}$, $BL_{22}$, are illustrated in FIG. 1. By this structure, the length of each bit line pair and the bit line current can be reduced by selectively turning either one of the bit line switching transistor pairs ($BLS_1$, $BLS_2$) on. The transistors in the memory cells, indicated by solid line circles, are turned on if, for example, data "1" is written in each of the memory cells $MC_1$ and $MC_2$. This means that the related transistors are symmetrically turned on with respect to the center of the related bit line pair. Such a symmetrical relationship is derived from the fact that the two transistors $Q_{12}$ and $Q_{21}$, receiving the output of the write amplifier commonly at their bases are, in actuality, fabricated in the form of a single multiemitter transistor. (This also applies to other corresponding two transistors.) However, each read/write transistor at both ends of the block ($Q_{11}$, $Q_{22}$ in FIG. 1) is not of the multi-emitter type but of the single emitter type.

Figure 2:
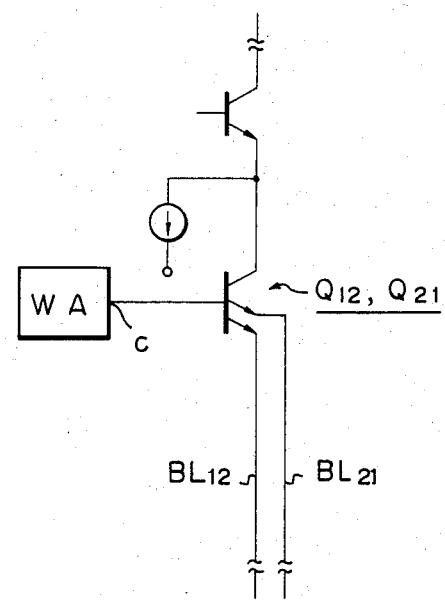
FIG. 2 is a circuit diagram of an actual set of the read/write transistors.

FIG. 2 is a circuit diagram of an actual set of the read/write transistors. As is apparent from FIG. 2, the read/write transistors $Q_{12}$ and $Q_{21}$ of FIG. 1 are replaced with a multiemitter transistor, the emitters of which are connected with the bit lines $BL_{12}$ and $BL_{21}$, respectively. The use of a single multiemitter transistor for the transistors $Q_{12}$ and $Q_{21}$ clearly reduces the number of transistors composing the memory. The same logic must necessarily appear, for the same write data $D_{in}$, at both bit lines $BL_{12}$ and $BL_{21}$.

Figure 3:
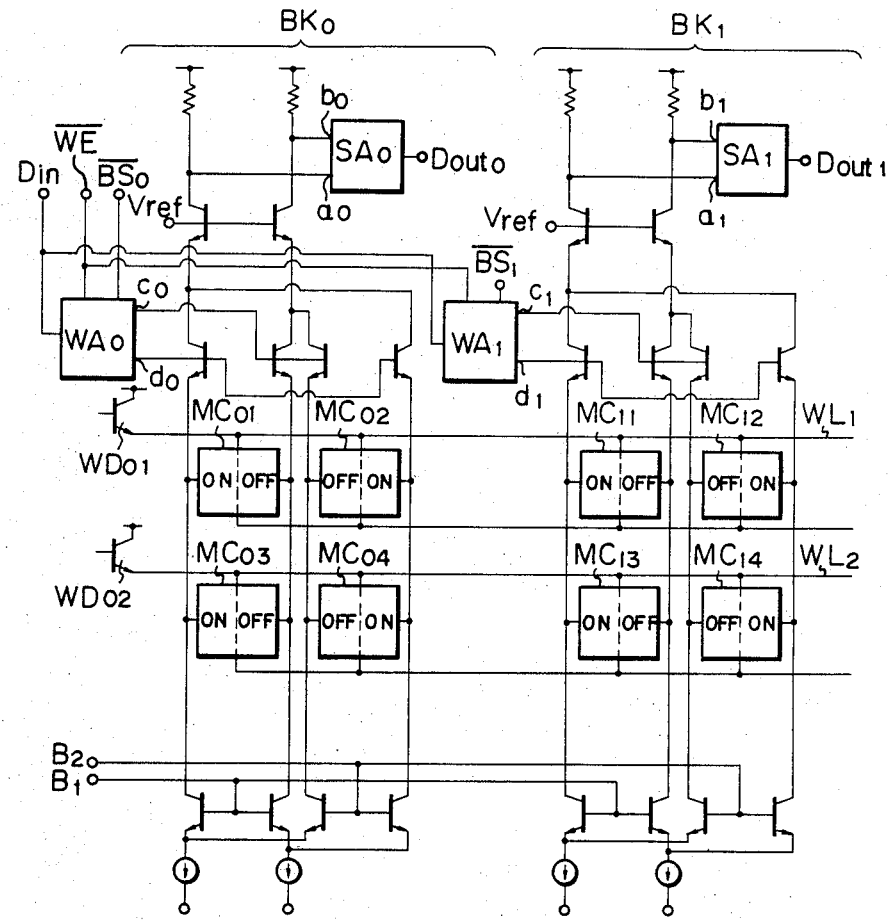
FIG. 3 is a circuit diagram of a prior art memory device constructed as a two-block type.

FIG. 3 is a circuit diagram of a prior art memory device of the two-block type. In FIG. 3, members the same as those of FIG. 1 are represented by the same reference characters, each having a suffix "0" or "1" depending on the block number to which it pertains (same for later figures). In FIG. 3, blocks $BK_0$ and $BK_1$ are illustrated. Each block operates independently from others and provides read data separately, such as $D_{out0}$ and $D_{out1}$. Even so, however, as many portions are constructed commonly to these blocks as possible from the viewpoint of simplification in circuit construction. For example, the write data $D_{in}$ is supplied to the blocks $BK_0$ and $BK_1$ commonly. Also, a write enable signal WE is supplied commonly thereto. Which block should be made active is determined through switching by block selection signals $\overline{BS}_0$ and $\overline{BS}_1$.

It should be recognized that, in FIG. 3, the above-mentioned common usage between the blocks is not always advantageous, but is conversely sometimes disadvantageous, especially during performance tests. In a performance test, the lesser number of test data patterns, the better. An increase in the number of test data patterns necessarily induces an increase in the number of steps for achieving the performance test. As a result, the products concerned cannot be manufactured less expensively. For this, the following steps are usually performed for the performance test. That is, in a usual performance test for the memory cells, data "1" or data "0", is written to all the memory cells and then it is detected whether all the memory cells produce the desired data "1" or "0".

In this case, there is a problem in that the blocks, each having the same structure as shown by BK in FIG. 1, are set up as shown by the blocks $BK_0$ and $BK_1$ in FIG. 3. Suppose that data "1" is written to all the memory cells MC's of FIG. 3. In this case, as previously explained, the ON transistors and the OFF transistors are arranged symmetrically as ON-OFF-OFF-ON. For example, the two transistors in the memory cell $MC_{01}$ are ON and OFF, while the two transistors in the adjacent memory cell $MC_{02}$ are OFF and ON. This is also true for other sets of memory cells, such as $MC_{11}$–$MC_{12}$ and $MC_{03}$–$MC_{04}$.

Figure 4:
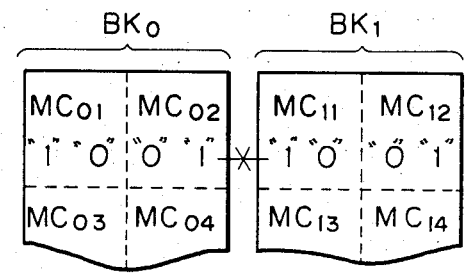
FIG. 4 schematically illustrates stored data held in a part of the memory cells shown in FIG. 3.

FIG. 4 schematically illustrates stored data held in a part of the memory cells shown in FIG. 3. In FIG. 4, data "1" and "0" are used for representing the ON and OFF states of the corresponding transistors shown in FIG. 3. Assume here that, in FIG. 4, a short-circuit of the bit lines occurs at the portion indicated by a mark "X". It is, of course, essential that the short-circuit X be detected during the performance test, so that the related semiconductor chip can be discarded or corrected. In actuality, however, such a short-circuit is not always detected. This is because the transistor and bit line located in the memory cell $MC_{02}$ and the confronting transistor and bit line located in the memory cell $MC_{11}$, between which there is a short-circuit, produce the same logic level, which state seems equivalent to the state where there is no short-circuit therebetween. It is important to note, however, that there is almost no possibility during an actual and usual memory operation that data "1" (or data "0") is written to all the memory cells as in a performance test. Conversely, different data is often written to the memory cells $MC_{02}$ and $MC_{11}$. Anyway the above possibility is determined according to the data to be written itself. When the memory cells $MC_{02}$ and $MC_{11}$ are supplied with different write data, a write error necessarily occurs due to the short-circuit of the bit lines. The same applies to a read operation, so that a read error will necessarily occur.

The memory according to the present invention can prevent the above write error and rear error through a very simple means, as recognized later.

Figure 5:
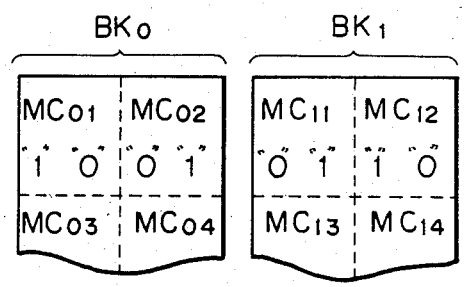
FIG. 5 schematically illustrates stored data held in a part of the memory cells for simply explaining the basic idea of the present invention.

FIG. 5 schematically illustrates stored data held in a part of the memory cells, which helps illustrate the basic idea of the present invention. The data pattern of FIG. 5 corresponds to that of FIG. 4, however, the difference here from FIG. 4 is that, when data "1" is written to all the memory cells, the data logics of FIG. 5 are reversed to that of FIG. 4 with respect to the block $BK_1$. To be specific, if the block $BK_0$ assumes data logic "1001", the adjacent block $BK_1$ assumes data logic "0110". Conversely, if the block $BK_0$ assumes data logic "0110", the block $BK_1$ assumes data logic "1001". The thus reversed data pattern between the blocks $BK_0$ and $BK_1$ makes it possible to detect the existence of a short-circuit from outside the memory, if such a short-circuit exists therein, since the data logic on one bit line in $BK_0$ is always opposite to the data logic on the facing bit line in $BK_1$ (which bit lines sandwich the short-circuit). Therefore, the difference in the logic level therebetween is electrically viewed from the outside. That is, a data logic to be "0" on one bit line is forcibly changed to a data logic "1" on the facing bit line through the short-circuit and vice versa. In any event, the obtained read data does not have the desired data logic due to the above mentioned change of data logic. Therefore, the existence of the short-circuit can immediately be determined by the change. Thus, the previously mentioned problem can be completely overcome.

The data logic patterns reversed between two adjacent blocks such as shown in FIG. 5 can be realized in the following way. Before explaining an example of the method for realizing the reversed data logic patterns, a brief explanation will be made regarding the operation of the conventional RAM block BK shown in FIG. 1. The operation will be understood referring to the following tables. Table I concerns the sense amplifier SA and Table II the write amplifier WA.

TABLE I

| a | b | $\overline{BS}$ | $D_{out}$ |
|---|---|---|---|
| x | x | HH | $D_{OL}$ |
| H | L | LL | $D_{OH}$ |

TABLE I-continued

| a | b | $\overline{BS'}$ | $D_{out}$ |
|---|---|---|---|
| L | H | LL | $D_{OL}$ |

TABLE II

| | $D_{in}$ | $\overline{WB}$ | $\overline{BS}$ | c | d |
|---|---|---|---|---|---|
| (1) | x | x | H | R | R |
| (2) | x | H | L | R | R |
| (3) | H | L | L | WH | WL |
| (4) | L | L | L | WL | WH |

In the above-recited tables, the meanings of the characters on the upper rows, i.e., a, b, c, d, $D_{in}$, $D_{out}$, $\overline{WE}$, $\overline{BS}$, and $\overline{BS'}$ have already been explained with reference to FIG. 1. In Table I, the symbol H represents a voltage level of 0 V, L −0.5 V, HH −0.8 V, and LL −2.1 V, $D_{OH}$ −0.85 V, $D_{OL}$ −1.75 V, for example. The symbol "X" denotes "don't care", that is, either H or L can be assumed.

In Table II, the symbol H represents a high level, L a low level, WH −0.8 V, WL −1.8 V, and R −1.2 V. In the left column, (1) represents a non-selection state, (2) a selection and read mode state, (3) a selection and write mode state with write data "1" (logic level H), and (4) a selection and write mode state with write data "0" (logic level L).

When the word line $WL_1$ is supplied with the "H" level to assume a selection state and, simultaneously, the first bit line switching transistor pair $BLS_1$ is placed in the selection state by the bit selection signal $B_1$, the memory cell $MC_1$ is rendered to be in a selection state, while each of other memory cells $MC_2 \sim MC_4$ is set in a non-selection state. During the read operation for the selected memory cell, the differential voltage between the base voltages existing in the selected memory cell travels, via the transistors $Q_{11}$, $Q_{12}$, to points a and b and appears thereacross. If, in FIG. 1, the point a assumes an "H" level while the point b assumes an "L" level, the resultant read data $D_{out}$ is produced as an "H" level. This is also true of a write operation, i.e., if a data $D_{in}$ of "H" is to be written in the memory cell $MC_1$, the base voltage of the transistor $Q_{11}$ should be lowered while the base voltage of the transistor $Q_{12}$ should be raised whereby the write operation for the cell $MC_1$ is completed, that is, cell transistor in the circle turns on.

It would become difficult to realize the reversed data pattern between the blocks $BK_0$ and $BK_1$ such as shown in FIG. 5, if the related RAM were composed of blocks each substantially the same as the block BK of FIG. 1 and set up with the construction as shown in FIG. 3. This is because at least the following three steps (I), (II), and (III) would be required for realizing the reversed data pattern. That is, (I) writing data "0" into all the memory cells (MC's), (II) writing data "1" into all the memory cells in the block $BK_1$, while the block $BK_0$ is left in a non-selection state, and (III) reading the stored data from the block $BK_0$ and investigating whether or not all the memory cells therein produce the data "0" correctly. The above-recited three sequential steps (I), (II), and (III) must be performed repeatedly for every block. This clearly increases the number of steps for the performance test of the RAM to be shipped.

Figure 6:
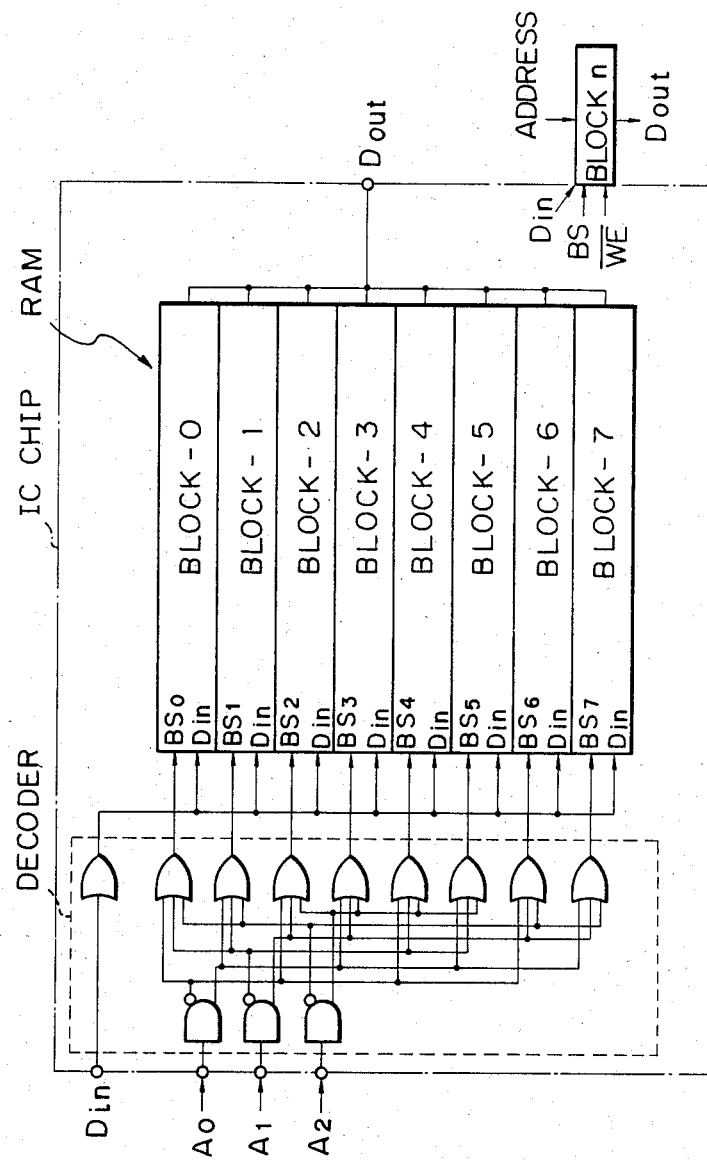
FIG. 6 is a circuit diagram of an example of an IC chip containing a RAM therein.

FIG. 6 is a circuit diagram of an example of an IC chip containing a RAM therein. The IC of FIG. 6 is used for explaining the prior art method for the performance test. In FIG. 6, the IC chip contains therein a RAM and a decoder. The RAM is built with eight blocks, i.e., block-0 through block-7, and receives the write data $D_{in}$ or provides the read data $D_{out}$. The block selection signals BS0 through BS7 are supplied, based on 3 bit block address A0, A1, and A3, from the decoder in order to select a corresponding one of the eight blocks. Each of the blocks is represented by block-n in the drawing. Each block is further controlled by the write enable signal $\overline{WE}$ and a memory cell address signal, reference merely by "Address" in FIG. 6.

According to the prior art method for the performance test of a RAM 2048 word×1 bit RAM, in the form of (256 words×1 bit)×8 blocks when each of the eight blocks is formed with a 256 word×1 bit memory, at least the following nine steps are needed:

(I) writing data "0" into all the memory cells of the block-0 through block-7, (II) giving the block address as A0, A1, A2=0, 1, 1 to select the block-1 and then writing data "1" thereinto, (III) giving the block address as A0, A1, A2=0, 0, 0 to select the block-3 and then writing data "1" thereinto, (IV) giving the block address as A0, A1, A2=0, 1, 0 to select the block-5 and then writing data "1" thereinto, (V) giving the block address as A0, A1, A2=0, 0, 1 to select the block-7 and then writing data "1" thereinto, (VI) giving the block address as A0, A1, A2=1, 1, 1 to select the block-0 and then reading data "0" therefrom, (VII) giving the block address as A0, A1, A2=1, 0, 0 to select the block-2 and then reading data "0" therefrom, (VIII) giving the block address as A0, A1, A2=1, 1, 0 to select the block-4 and then reading data "0" therefrom, and (IX) giving the block address as A0, A1, A2=1, 0, 1 to select the block-6 and then reading data "0" therefrom.

In the above steps, if the data "0" is read correctly at each of the steps (VI) through (IX), it is concluded that there is no short-circuit of the line in the RAM.

It should be noted that the above-mentioned prior art method is useful only for a case where the relationship between the block address A0, A1, A2 and the eight block selection signals is fixed. In other words, the prior art method is useful only when the maker knows, in advance, the correspondence between A0, A1, A2 and BS0 through BS7. Thus, it is impossible to apply the aforementioned prior art method to recent IC chips of RAM's.

This will be clarified by the following. The recent trend is to construct a RAM, together with a logic circuit, all in one IC chip. In this case, the logic circuit is made of a so-called gate array. The gate array is, as known, very useful for obtaining great varieties of logic circuits merely by suitably arranging lines between preformed gates. For this, the decoder of FIG. 6 for recent RAM's is fabricated by using the gate array. Here, a problem arises in that the wiring chart of such a gate-array type decoder is not known by a maker, but only by the designer i.e. user. This means that the maker cannot determine the aforesaid correspondence between the block address A0, A1, A2 and the eight block selection signals BS0 through BS7. Or, even if the maker knows the relationship between the blocks, such a discrimination of the test according to the block information gives a big burden to the maker during the test procedure. Thus, it is impossible or difficult to use the prior art method for the performance test for recent RAM's provided with gate-array type decoders.

Compared with the above-explained prior art method, the number of steps for the test can be drastically decreased with the use of the RAM according to the present invention. Also, there is no problem with the test for the RAM according to the present invention even with a gate-array type decoder.

In short, the reversed data pattern of FIG. 5 allows a drastic reduction in the number of the steps for the test. That is, once data "1" (or "0") is written into all the memory cells, any undesired short-circuits of the bit lines can be detected during a read operation. the read operation cycles take place sequentially for every block and also for every memory cell, as in the prior art procedure. Incidentally, only short-circuits of the bit lines are taken into consideration, though write errors and read errors may be caused by other factors as well.

Figure 7:
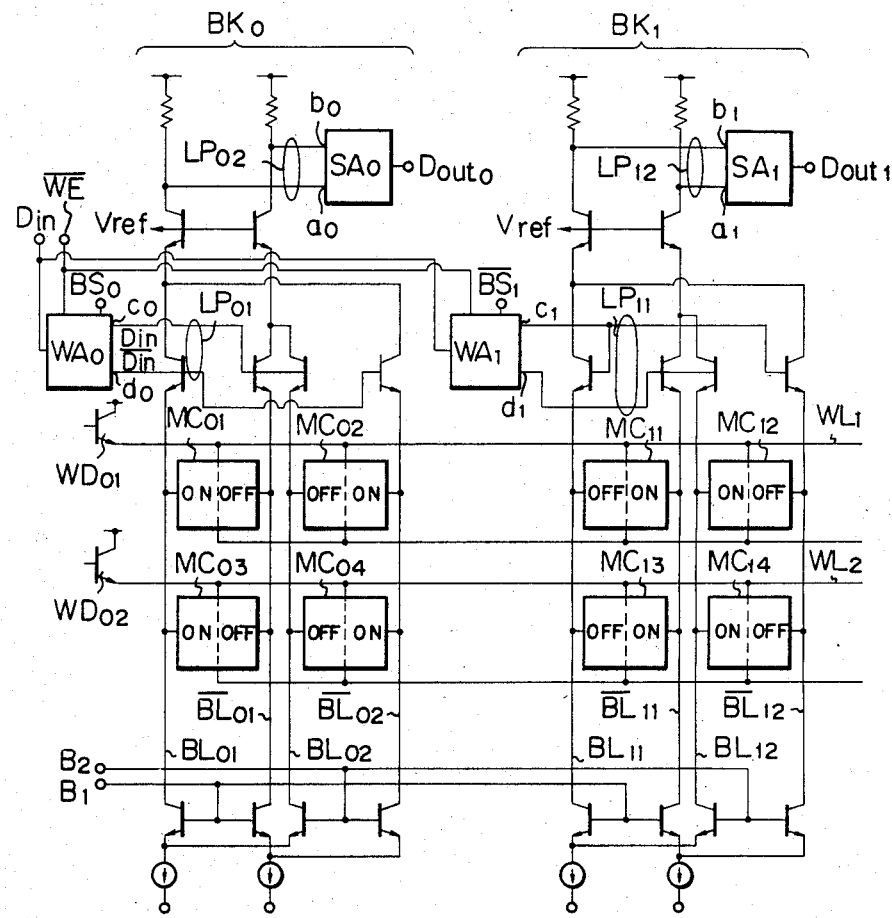
FIG. 7 is a circuit diagram of a semiconductor memory device according to an embodiment of the present invention.

FIG. 7 is a circuit diagram of a semiconductor memory device according to an embodiment of the present invention. The semiconductor memory device of this figure can realize the reversed data pattern as shown in FIG. 5. In FIG. 7, the structure of the device according to the present invention is substantially the same as that of the prior art. To be specific, the following members in each block are common to the memory devices of the prior art and the present invention, i.e., a plurality of bit line pairs BL, $\overline{BL}$ ($BL_{01}$, $\overline{BL}_{01}$), ($BL_{11}$, $\overline{BL}_{11}$) and so on, a plurality of word lines $WL_1$, $WL_2$ and so on, a plurality of memory cells (MC's) intersecting therewith, write amplifiers $WA_0$, $WA_1$ producing at their terminals (c, d) complementary write data ($D_{in}$, $\overline{D}_{in}$) and supplying them to respective bit line pairs, and sense amplifiers $SA_0$, $SA_1$ receiving at their terminals (a, b) complementary levels according to the selected memory cell and producing them as the read data $D_{out0}$, $D_{out1}$.

However, particular attention should be directed to first wiring line pair patterns $LP_{01}$ and $LP_{11}$, which are wired for connecting the bit line pairs with the corresponding write amplifiers, and second wiring line pair patterns $LP_{02}$ and $LP_{12}$, which are wired for connecting the bit line pairs with the corresponding sense amplifiers. In this arrangement, it is important to note that the patterns $LP_{01}$ and $LP_{02}$ of the block $BK_0$ are not the same as the patterns $LP_{11}$ and $LP_{12}$ of the block $BK_1$. Concretely speaking, the first wiring line pair patterns $LP_{01}$ and $LP_{11}$ are formed in reverse with each other. Similarly, the second wiring line pair patterns $LP_{02}$ and $LP_{12}$ are formed in reverse with each other. As will be understood from the above, the difference between the devices of the prior art and the present invention is only that the wiring line pair patterns of two adjacent blocks are reversely formed with each other. This means only a very small modification in hardware need be made and very few elements need be introduced for fabricating the memory device.

As a result, in the memory device with the thus modified wiring line pair patterns as exemplified in FIG. 7, when data "1" is written into all the memory cells, the transistors in the block $BK_0$ are made conductive (ON) or nonconductive (OFF) with a pattern, such as ON-OFF-OFF-ON, but the transistors in the block $BK_1$ assume the opposite pattern, such as OFF-ON-ON-OFF. This pattern is equivalent to the reversed data pattern between the blocks $BK_0$ and $BK_1$ shown in FIG. 5. Accordingly, the afore-mentioned steps (I), (II), and (III) in the former case and also the afore-mentioned steps (I) through (IX) in the latter case can be drastically simplified. It should finally be noted that the reversed wiring line pair patterns of the present invention do not induce any change in the usual read/write operations.

As explained above in detail, the present invention is effective for reducing the number of steps for the performance test of the memory merely by effecting small change in design of the conventional memory structure.

What is claimed is:

1. A semiconductor memory device provided with a plurality of blocks, each of said plurality of blocks comprising:
   a plurality of bit line pairs;
   a plurality of word lines defining intersections with said bit line pairs;
   a plurality of memory cells respectively located at said intersections between said bit line pairs and the word lines;
   means for writing data into the memory cells of each of said blocks so that complementary data is written in the memory cells of adjacent ones of said bit line pairs of the same block; and
   means for reading stored data from the memory cells, said means for reading stored data including a data output terminal for outputting the stored data;
   said writing means in each of said blocks has a wiring pattern having a mirror image with respect to that of said writing means in each other one of said blocks that is adjacent thereto, so that logic levels appearing at respective adjacent ones of said bit lines of said adjacent blocks are complementary, and
   said reading means in each said block has a wiring pattern having a mirror image with respect to that of said reading means in each other one of said blocks that is adjacent thereto.

2. The device of claim 1, wherein said wiring patterns of said reading means of each said adjacent pair of blocks have the same mirror image with respect to each other as said wiring patterns of said writing means.

3. A semiconductor memory device as set forth in claim 1, wherein:
   said writing means includes, for each said block, a respective writing amplifier, and the respective wiring pattern includes respective wiring lines for writing into the memory cells of the block, arranged between the corresponding bit line pairs of the block and the write amplifier;
   said reading means includes, for each said block, a respective sense amplifier, and the respective wiring pattern includes respective wiring lines for reading out the memory cells of the block, arranged between the corresponding bit line pairs of the block and the sense amplifier;
   said wiring lines of said writing means of each adjacent pair of said blocks are formed having a mirror image with respect to each other; and
   said wiring lines for the read operation of each adjacent pair of said blocks are formed in reverse with respect to each other.

4. A semiconductor memory device as set forth in claim 3, wherein:
   said wiring lines of said writing means for each said block includes a respective wiring line pair via which data $D_{in}$ and $\overline{D}_{in}$ are respectively written from the write amplifier into a selected one of the memory cells of the block;

said wiring lines of said reading means for each said block includes a respective wiring line pair via which stored data of a selected one of the respective memory cells is respectively sensed by the sense amplifier and produced therefrom as a read data $D_{out}$;

said wiring line pairs of said writing means of each adjacent pair of said blocks are formed in reverse with respect to each other; and said second wiring line pairs of said reading means of each adjacent pair of said blocks are formed having a mirror image with respect to each other.

5. A semiconductor memory device as set forth in claim 4, wherein the memory device is a static random access memory comprising, in each of said blocks, a multi-emitter transistor operatively connected between the write amplifier and a respective one of the bit lines in said bit line pairs and two single-emitter transistors operatively connected to corresponding ones of said bit line pairs and the write amplifier by way of respective ones of said wiring lines of each of said blocks.

6. A semiconductor memory device as set forth in claim 5, wherein:

said wiring lines of said writing means of each of said blocks are formed having a mirror image with respect to those of each adjacent block in such a manner that two adjacent ones of said bit lines, respectively pertaining to two adjacent ones of said blocks, assume complementary logic levels from each other when the same logic data is written into respective adjacent memory cells of the adjacent ones of said blocks.

7. The device of claim 6, wherein said two adjacent ones of said bit lines of said respective adjacent blocks assume said complementary logic levels when said same logic data is written into all of said memory cells of each of said blocks.

8. The device of claim 6, wherein testing by writing said same logic data into all of said memory cells allows testing for short circuits between all of the adjacent ones of said bit lines of the respective different adjacent ones of said blocks.

9. The device of claim 6, comprising a decoder for inputting respective addresses for selecting said blocks, wherein testing for short circuits between adjacent ones of said bit lines of respective different adjacent ones of said blocks can be tested by entering said same logic data in the respective adjacent ones of said memory cells of said adjacent blocks without knowledge of the addresses of each of said blocks.

* * * * *

UNITED STATES PATENT AND TRADEMARK OFFICE
CERTIFICATE OF CORRECTION

PATENT NO. : 4,692,900

DATED : SEPTEMBER 8, 1987

INVENTOR(S) : KAZUO OOAMI ET AL.

It is certified that error appears in the above-identified patent and that said Letters Patent is hereby corrected as shown below:

Col. 2, line 55, before "sources" insert --memory cells is maintained by means of hold current--;

line 59, "lines" should be --line--.

Col. 5, line 9, Table II, "$\overline{WB}$" should be --$\overline{WE}$--.

Col. 7, line 17, "the read" should be --The read--.

Signed and Sealed this

Second Day of February, 1988

Attest:

DONALD J. QUIGG

Attesting Officer

Commissioner of Patents and Trademarks